(12) United States Patent
O'Brien

(10) Patent No.: US 7,843,070 B2
(45) Date of Patent: Nov. 30, 2010

(54) NANOTUBE AND METAL COMPOSITE INTERCONNECTS

(75) Inventor: Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 355 days.

(21) Appl. No.: 12/034,635

(22) Filed: Feb. 20, 2008

(65) Prior Publication Data
US 2009/0206483 A1 Aug. 20, 2009

(51) Int. Cl.
*H01L 29/66* (2006.01)
(52) U.S. Cl. ............... 257/773; 257/E51.04; 977/810
(58) Field of Classification Search .......... 257/773, 257/E51.04; 977/810
See application file for complete search history.

(56) References Cited

U.S. PATENT DOCUMENTS

| 7,112,472 | B2 * | 9/2006 | Dubin ............... 438/122 |
| 7,220,671 | B2 | 5/2007 | Simka et al. |
| 7,335,603 | B2 * | 2/2008 | Mancevski ......... 438/758 |
| 7,655,548 | B2 * | 2/2010 | Byrn ............... 438/586 |
| 2010/0065820 | A1 * | 3/2010 | Tombler, Jr. ......... 257/24 |

* cited by examiner

*Primary Examiner*—Eugene Lee
(74) *Attorney, Agent, or Firm*—Cool Patent, P.C.; Joseph P. Curtin

(57) ABSTRACT

Nanotube and metal composite interconnects are generally described. In one example, an apparatus includes an interlayer dielectric (ILD) and one or more interconnect structures coupled to the ILD, the one or more interconnect structures including a composite of metal and one or more nanotubes.

6 Claims, 5 Drawing Sheets

Figure 1
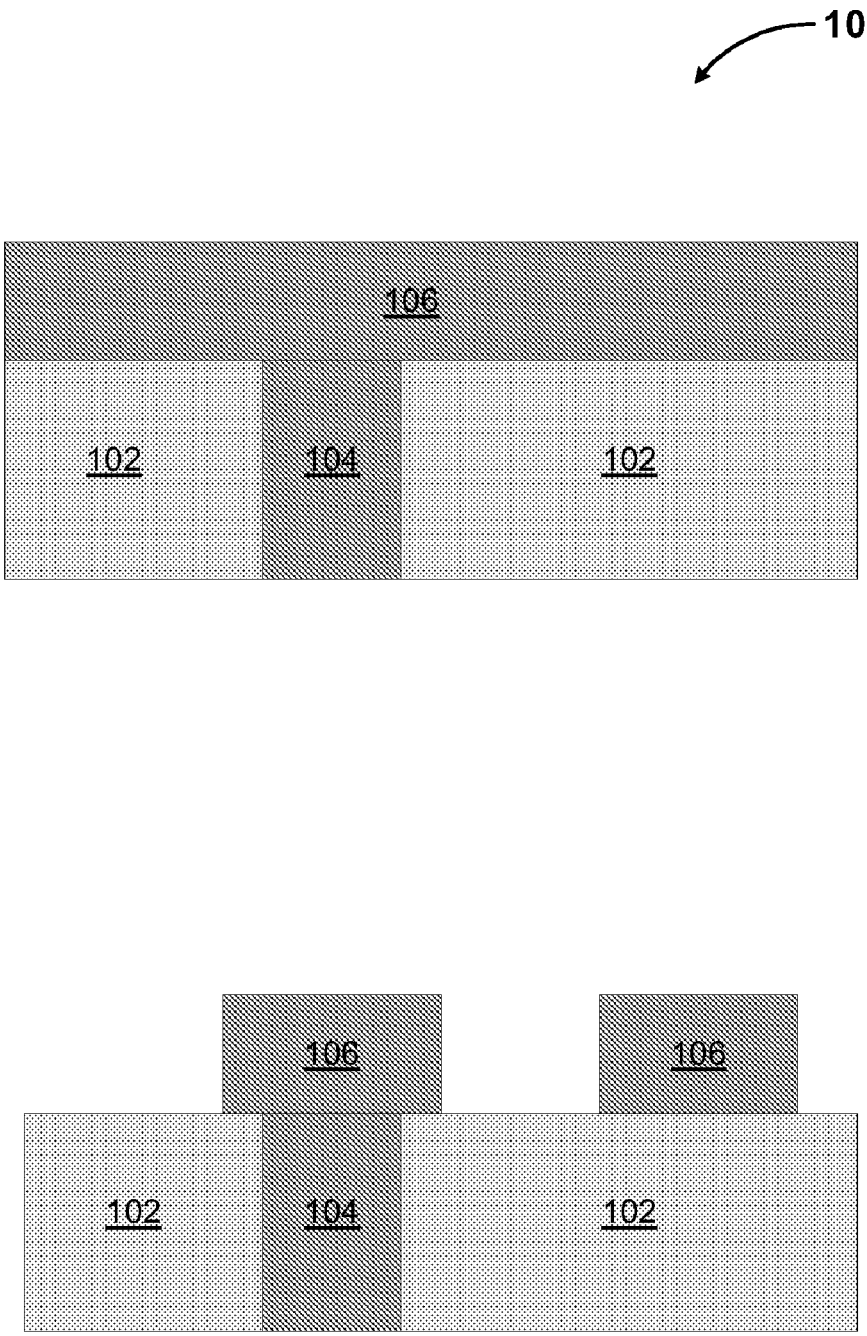
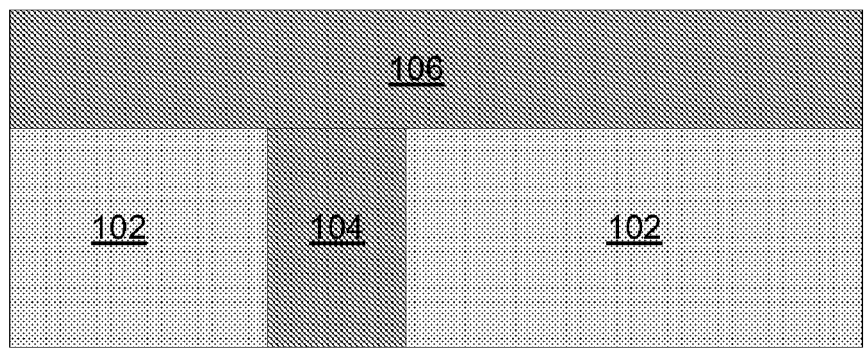
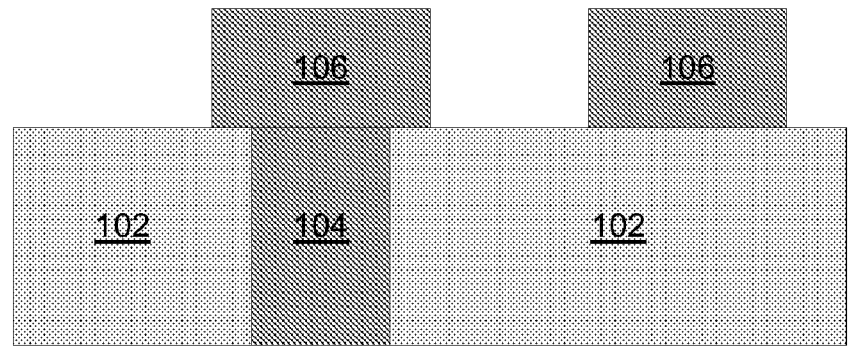

NANOTUBE AND METAL COMPOSITE INTERCONNECTS

BACKGROUND

Generally, interconnects are electrically conductive structures that electrically couple one or more transistors of a microelectronic device with other internal or external components, devices, or systems.

BRIEF DESCRIPTION OF THE DRAWINGS

Embodiments disclosed herein are illustrated by way of example, and not by way of limitation, in the figures of the accompanying drawings in which like reference numerals refer to similar elements and in which:

FIG. 1 is a side-view cross-section process schematic of nanotube and metal composite interconnect fabrication, according to but one embodiment;

Figure 2:
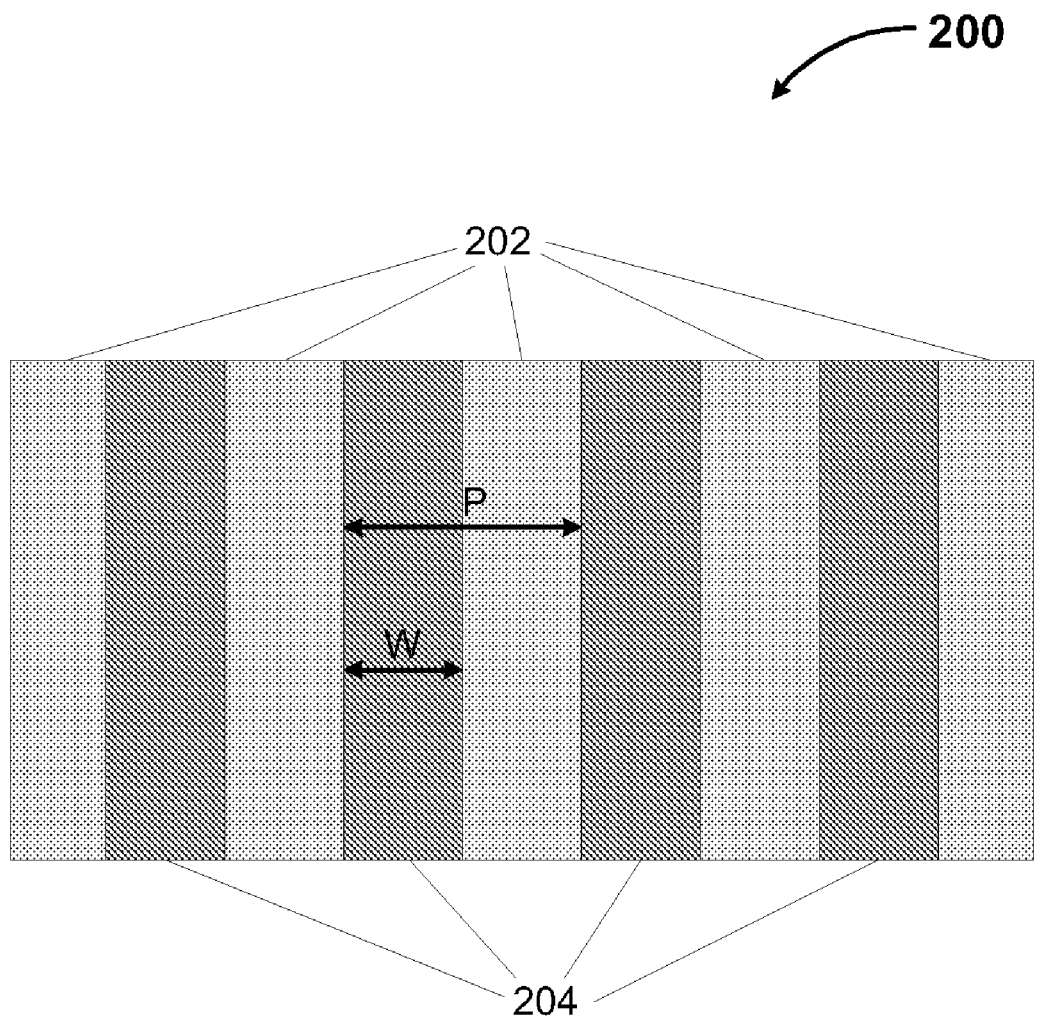
FIG. 2 is a top-view schematic of nanotube and metal composite interconnects, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of nanotube and metal composite interconnects are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a side-view cross-section process schematic of nanotube and metal composite interconnect fabrication, according to but one embodiment. Interconnects may be electrically conductive structures that electrically couple one or more transistors of a microelectronic device with other components, devices, or systems. The resistivity of current Cu- and/or Al-based interconnect architectures may dramatically increase as interconnect dimensions scale below 100 nm pitches due in part to surface and/or grain scattering events. Such increase in resistivity may escalate interconnect resistance beyond driver resistance and/or intrinsic resistive capacitive (RC) delay, potentially limiting both power and performance of future devices. Nanotube and metal composites may provide an alternative interconnect material that satisfies interconnect resistance and current requirements for scaled technologies. For example, nanotube/metal composites may demonstrate lower resistance than copper, aluminum, or tungsten.

In an embodiment according to FIG. 1a, an apparatus 100 includes an interlayer dielectric (ILD) 102, a via interconnect 104, and a metal and nanotube composite material 106, each coupled as shown. FIG. 1a may depict blanket deposition of metal and nanotube composite material 106 to ILD 102. In an embodiment, ILD 102 may be part of an exposed via- or contact-patterned layer and may include silicon oxide, carbon-doped silicon oxide (CDO), or any other suitable interlayer dielectric material.

A metal and nanotube composite material 106 may include a variety of different metals in one or more embodiments. In an embodiment, a metal is broadly defined to refer to any crystal or amorphous material that does not have gate dependence to its resistance. In another embodiment, a metal includes semiconductors. In yet another embodiment, a metal includes materials that have a conductivity that is changed in an electric field of about 1 volt (V) for a distance equal to about the critical dimension (CD) or smallest dimension of a structure made of the material. A metal may be a material that does not tend to form a carbide or boride with carbon- or boron-based nanotubes. A metal may include, for example, gold (Au), ruthenium (Ru), copper (Cu), silver (Ag), cobalt (Co), and/or aluminum Al, or similar elements or compounds, or suitable combinations thereof, although the scope of the claimed subject matter is not limited in these respects.

A metal and nanotube composite material 106 may include a variety of different nanotubes in one or more embodiments. In one embodiment, a nanotube refers to any tubular material of nanometer-scale. A nanotube for use in a metal and nanotube composite may include single-wall nanotubes or multi-wall nanotubes. In another embodiment, a nanotube includes functionalized and/or non-functionalized tubes. Nanotubes may include carbon nanotubes, boron nanotubes, other elements, or combinations thereof. In an embodiment, nanotubes include oriented nanotubes, semi-oriented nanotubes, or combinations thereof. In yet another embodiment, the one or more nanotubes have an average length greater than about 5 pm, however, the scope of the claimed subject matter is not limited in these respects.

Deposition of metal and nanotube composite material 106 may be accomplished in a variety of ways. In an embodiment, a metal is deposited by physical vapor deposition (PVD), chemical vapor deposition (CVD), atomic layer deposition (ALD), evaporation, molecular beam epitaxy (MBE), any suitable deposition method, or combinations thereof. One or more nanotubes may be deposited by chemical vapor deposition (CVD), plasma-enhanced CVD (PECVD), hot filament CVD (HFCVD), solution-based chemistries, placement, other suitable methods, or combinations thereof, and the scope of the claimed subject matter is not limited in these respects.

A metal and nanotube composite material 106 may be formed in a variety of ways. For example, in one embodiment, one or more nanotubes are deposited to ILD 102, followed by deposition of metal to the one or more nanotubes to form a composite. In another embodiment, a metal is deposited to ILD 102, followed by deposition of one or more nanotubes to the metal to form a composite. Such actions may be sequentially repeated, in any order, to form metal and nanotube composite material 106 of a selected thickness. The thickness may be selected to provide sufficient material to form an interconnect structure in a microelectronic device.

In one embodiment, the thickness of composite 106 varies according to the embedded nature of the interconnect structure to be formed using the metal and nanotube composite material 106. For example, in one embodiment, a first interconnect layer may be referred to as Metal 1, a second interconnect layer formed after the first interconnect layer may be referred to as Metal 2, and so forth. A microelectronic device may include greater than ten interconnect layers, in one embodiment. A selected thickness for composite 106 may generally increase in subsequent interconnect layers, but is not necessarily limited in this regard. In an embodiment, one or more nanotubes are deposited until a thickness of about 0.4 nm to 5 nm is achieved and a metal is deposited to the one or more nanotubes until a thickness of about 0.4 to 5 nm is achieved. Such actions may occur in any order and/or sequentially until a final desired thickness of composite 106 is achieved.

In an embodiment, according to FIG. 1b, an apparatus 100 includes ILD 102, via interconnect 104, and one or more metal and nanotube composite interconnect structures 106, each coupled as shown. FIG. 1b may be a depiction of FIG. 1a after patterning the metal and nanotube composite material 106 of FIG. 1a to form one or more interconnect structures 106 of a microelectronic device. Patterning may include lithography processes, such as spin, expose, and develop of a masking layer and/or etching of the composite 106, and so forth, and the scope of the claimed subject matter is not limited in this respect.

In an embodiment, the one or more interconnect structures 106 include line structures to electrically couple one or more transistors of a microelectronic device with other electrical components, devices, or systems. One or more interconnect structures 106 may be electrically coupled with other interconnect structures of adjacent layers, such as via 104.

The one or more composite interconnect structures 106 may have lower resistivity and higher current density flux (Jmax) in comparison to pure copper in scaled microelectronic applications, for example. In one embodiment, the composite interconnect structures 106 have a resistivity of about 1 to 10 $\mu\Omega$-cm and a Jmax greater than about $1\times10^6$ $A/cm^2$. In another embodiment, the one or more composite interconnect structures 106 include a percentage of metal by volume and a percentage of one or more nanotubes by volume that are about equivalent. In yet another embodiment, the interconnects 106 have greater than about $5\times10^{13}$ nanotubes/$cm^2$. An average length of oriented or semi-oriented nanotubes greater than about 5 $\mu$m may be suitable for interconnect 106 applications. In an embodiment, oriented or semi-oriented nanotubes include nanotubes that are generally disposed lengthwise in a similar direction moreso than a random mesh of nanotubes. An electric field may be used to orient the nanotubes during deposition, for example. Strips of nanotube molecules may be deposited using an aminopropyl triethoxysilane (APTS) deposition method or other surface chemical treatments. In an embodiment, a metal and nanotube composite form one or more low resistance wires.

FIG. 2 is a top-view schematic of nanotube and metal composite interconnects, according to but one embodiment. In an embodiment, an apparatus 200 includes interlayer dielectric (ILD) 202, and one or more interconnect structures 204 coupled to the ILD 202. Interconnect structures and/or ILD may comport with one or more embodiments already described with respect to FIGS. 1a-b.

One or more interconnect structures 204 may include substantially parallel line structures having a width, W, separated from one another by substantially uniform pitch, P. In an embodiment, interconnect structures 204 have a width of about 2 nm to 20 nm and a uniform pitch of about 5 nm to 30 nm. The line structures 204 may electrically couple one or more transistors of a microelectronic device with other electrical components, devices, or systems.

In an embodiment, the interconnect structures 204 include metal and nanotube composite material having semi-oriented or oriented nanotubes that are generally or substantially oriented in a lengthwise direction that is substantially parallel to the line structures 204. In another embodiment, the oriented and/or semi-oriented nanotubes include nanotubes having an average length greater than about 5 $\mu$m and/or a concentration of nanotubes greater than about $5\times10^{13}$ nanotubes/$cm^2$. In other embodiments, the concentration of nanotubes may be less than $5\times10^{13}$ nanotubes/$cm^2$. Nanotubes may be oriented such that a small angle approximation, $\Theta$, is less than about 5 nm/10,000 nm in which 5 nm refers to a line critical dimension (CD) and in which 10,000 nm refers to an average distance for nanotube linking. In another embodiment, nanotubes are oriented such that $\Theta$ is less than about 5 nrm/1,000 nm. In other embodiments, nanotubes are oriented such that $\Theta$ is less than a line critical dimension/1,000-10,000 nm.

Figure 3:
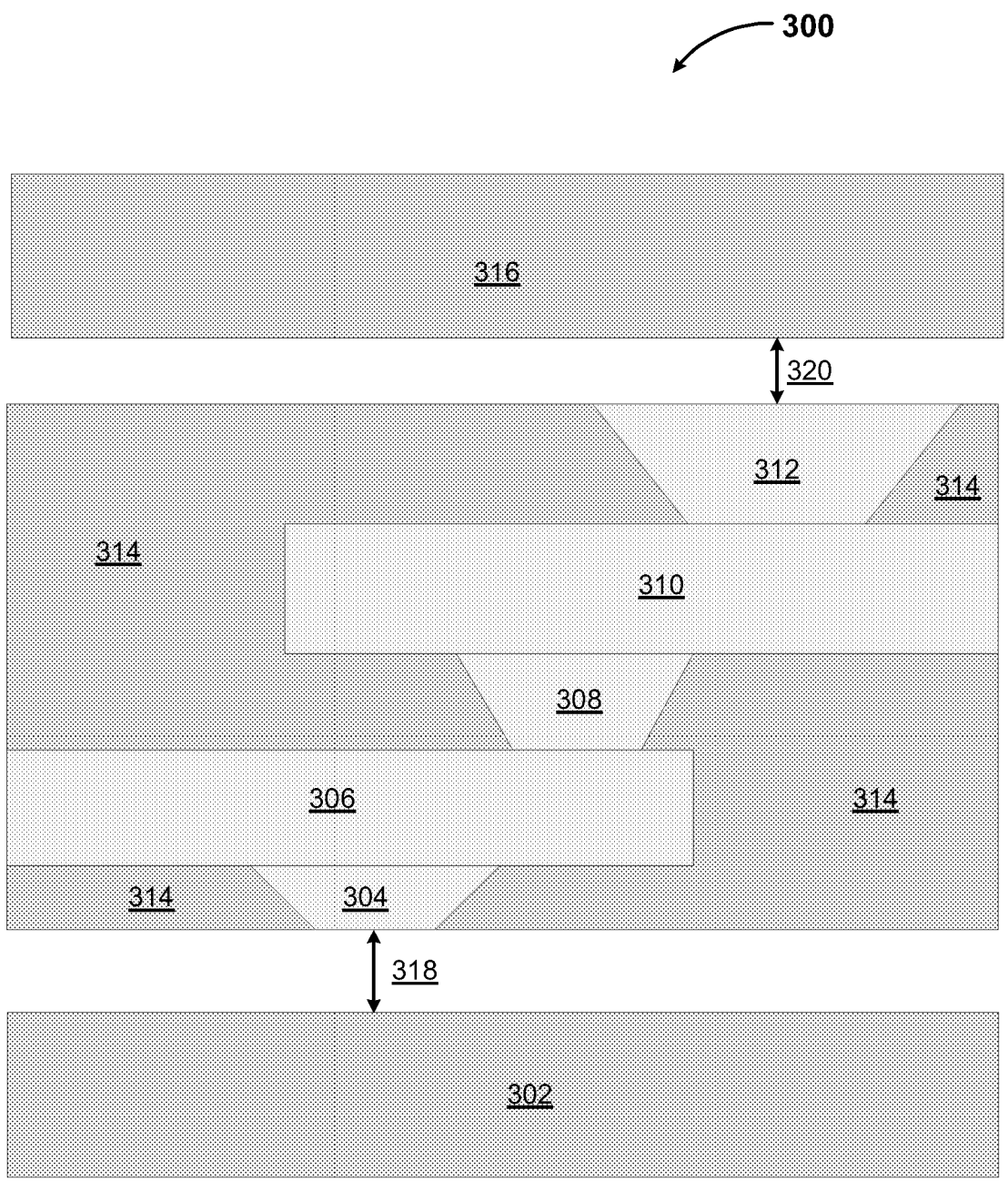
FIG. 3 is a side-view cross-section schematic of nanotube and metal composite interconnects, according to but one embodiment.

FIG. 3 is a side-view cross-section schematic of nanotube and metal composite interconnects, according to but one embodiment. In an embodiment, an apparatus 300 includes one or more transistors of a microelectronic device 302, one or more interconnect structures 304, 306, 308, 310, 312, interlayer dielectric (ILD) 314, and other electrical components, devices, or systems 316, each coupled as shown.

An apparatus 300 may include one or more interconnect structures 304, 306, 308, 310, 312 to electrically couple 318, 320 one or more transistors of a microelectronic device 302 with other electrical components, devices, or systems 316. In an embodiment, the one or mote interconnect structures 304, 306, 308, 310, 312, include metal and nanotube composite material as disclosed herein.

Source and/or drain regions of one or more transistor devices 302 may be electrically coupled 318 to a first interconnect structure 304, which may be electrically coupled in various stacked layers with other succeeding interconnect structures 306, 308, 310, 312, for example. In other embodiments, more or less interconnect structures 306, 308, 308, 310, 312 may be used than depicted. A final interconnect structure, such as interconnect 312, for example, may electrically couple 320 the one or more transistor devices 302 with other electrical components, devices and/or systems 316. In an embodiment, one or more interconnects 304, 306, 308, 310, 312 are part of an integrated circuit including one or more transistor devices 302.

Electrical components, devices and/or systems 316 may include a package substrate, for example. In other embodiments, electrical components, devices, and/or systems 316 include elements described with respect to system 500 in FIG. 5.

Figure 4:
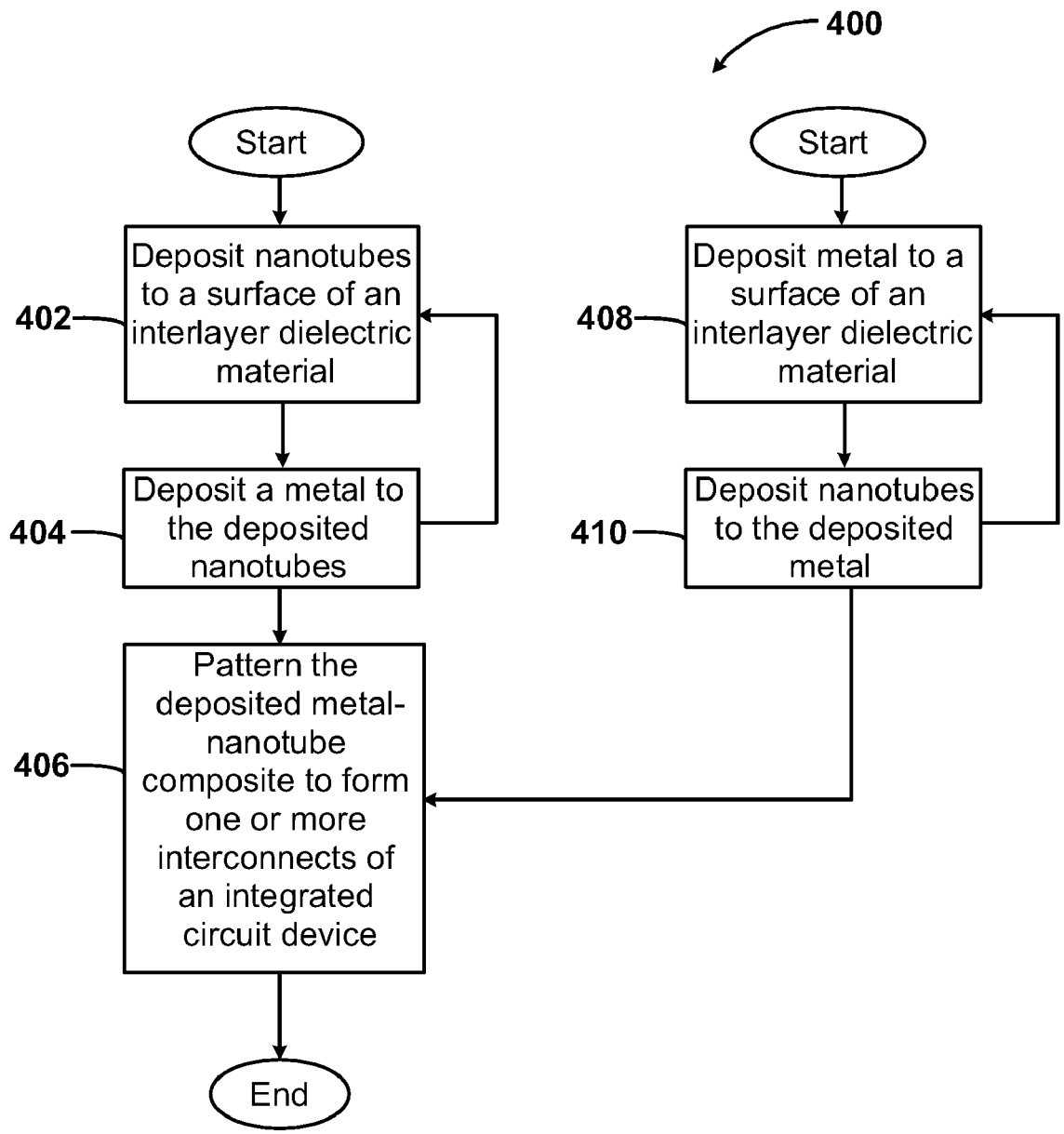
FIG. 4 is a flow diagram of a method for fabricating nanotube and metal composite interconnects, according to but one embodiment.

FIG. 4 is a flow diagram of a method for fabricating nanotube and metal composite interconnects, according to but one embodiment. In an embodiment, a method 400 includes depositing nanotubes to a surface of an interlayer dielectric (ILD) at box 402, depositing a metal to the deposited nanotubes at box 404, and patterning the deposited metal and nanotube composite to form one or more interconnects of an integrated circuit device at box 406. In another embodiment, a method 400 includes depositing a metal to a surface of an ILD at box 408, depositing nanotubes to the deposited metal at box 410, and patterning the deposited metal and nanotube composite to form one or more interconnects of an integrated circuit device at box 406. Actions associated with boxes 402 and 404 or 408 and 410 may be sequentially repeated multiple times until a desired composite thickness is achieved.

Depositing a metal to an ILD 408 or depositing a metal to one or more nanotubes 404 may include depositing Au, Ru, Cu, Ag, Co, Al, similar elements or compounds, or suitable combinations thereof. In other embodiments, depositing a metal 404, 408 includes depositing a metal according to the following embodiments. In one embodiment, a metal may include a combination of different metals. In another embodiment, a metal is broadly defined to refer to any crystal or amorphous material that does not have gate dependence to its resistance. In another embodiment, a metal includes semiconductors. In yet another embodiment, a metal includes materials that have a conductivity that is changed in an electric field of 1 V.

Depositing a metal to an ILD 408 or depositing a metal to one or more nanotubes 404 may be accomplished by a variety of deposition methods. In one embodiment, depositing a metal 404,408 is accomplished by physical vapor deposition (PVD), chemical vapor deposition (CVD), atomic layer deposition (ALD), evaporation, molecular beam epitaxy (MBE), any suitable deposition method, or combinations thereof. Such deposition methods are examples and other deposition methods may be used in other embodiments.

Depositing one or more nanotubes to an ILD 402 or depositing one or more nanotubes to a metal 410 may include depositing one or more single-wall nanotubes, multi-wall nanotubes, oriented nanotubes, semi-oriented nanotubes, or combinations thereof. Depositing nanotubes 402, 410 may be performed in the presence of an electric field to fabricate oriented or semi-oriented nanotubes. Depositing nanotubes 402, 410 may also include depositing nanotubes that include carbon, boron, other suitable elements, or combinations thereof. The one or more nanotubes may have an average length greater than about 5 μm.

Depositing one or more nanotubes to an ILD 402 or depositing one or more nanotubes to a metal 410 may be accomplished by a variety of techniques. In an embodiment, depositing one or more nanotubes 402, 410 is accomplished by chemical vapor deposition (CVD), plasma-enhanced CVD (PECVD), hot filament CVD (HFCVD), solution-based chemistries, placement, other suitable methods, or combinations thereof. Deposition methods for nanotubes listed above may be examples of a variety of techniques that may be used and other deposition methods may be used in other embodiments.

A nanotube and metal composite may be formed by alternating metal 404, 408 and nanotube 402, 410 deposition techniques. In an embodiment, depositing a metal 404, 408 includes depositing a metal until a thickness between about 0.4 m and 5 nm is achieved. In another embodiment, depositing nanotubes 402, 410 includes depositing nanotubes until a thickness between about 0.4 nm and 5 nm is achieved. Such metal deposition 404, 408 and nanotube deposition 402, 410 may be sequentially repeated until a final selected thickness for a composite is achieved.

A method 400 may include patterning the composite 406 to form one or more interconnect structures. Patterning the composite 406 may form one or more parallel line structures separated by substantially uniform pitch. In an embodiment, the pitch is about 5 nm to 30 nm. The line structures may electrically couple one or more transistors of a microelectronic device such as an integrated circuit with other electrical components, devices, or systems. In an embodiment, the nanotubes of a composite are oriented or semi-oriented nanotubes that are substantially oriented or disposed in a lengthwise direction that is substantially parallel to the line structures. In another embodiment, the oriented and/or semi-oriented nanotubes include nanotubes having an average length greater than about 5 μm and/or a concentration of nanotubes greater than about $5 \times 10^{13}$ nanotubes/cm$^2$. Nanotubes may be oriented such that Θ is less than about 5 nm/10,000 nm. Patterning the composite 406 may form one or more interconnects having a resistivity between about 1 to 10 μΩ-cm and a Jmax greater than about $1 \times 10^6$ A/cm$^2$.

A method 400 may further include anneal or other thermal processing steps to reduce and/or eliminate voids that may exist in the deposited metal and nanotube composite. In an embodiment, anneal takes place after deposition 402, 404, 408, 410 and prior to patterning 406. In another embodiment, anneal takes place after patterning the metal-nanotube composite to form one or more interconnect structures 406.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 5:
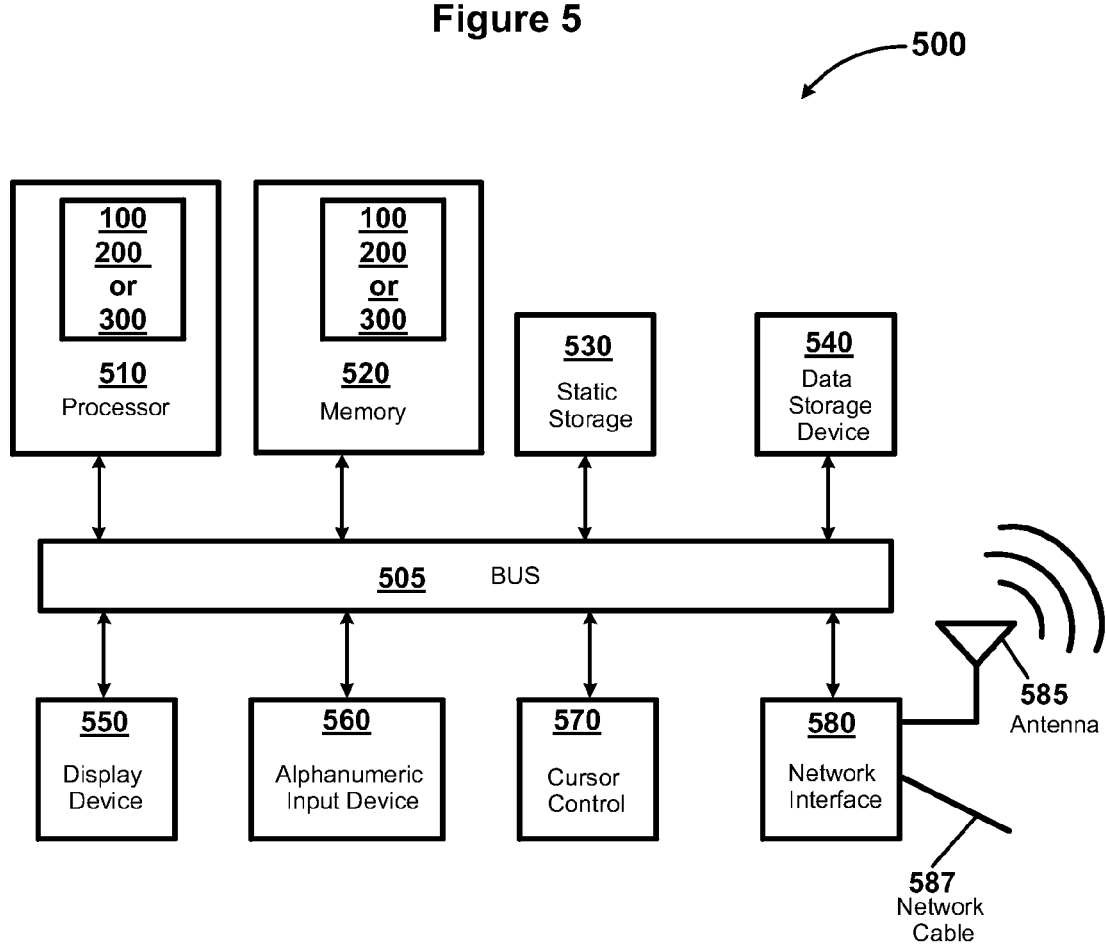
FIG. 5 is a diagram of an example system in which embodiments of the present invention may be used, according to but one embodiment.

FIG. 5 is a diagram of an example system in which embodiments of the present invention may be used, according to but one embodiment. System 500 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 500 includes an apparatus 100, 200 having nanotube and metal composite interconnects in accordance with embodiments described with respect to FIGS. 1-4. In an embodiment, an apparatus 100, 200, 300 having nanotube and metal composite interconnects as described herein is part of an electronic system's processor 510 or memory 520.

Electronic system 500 may include bus 505 or other communication device to communicate information, and processor 510 coupled to bus 505 that may process information. While electronic system 500 may be illustrated with a single processor, system 500 may include multiple processors and/or co-processors. In an embodiment, processor 510 includes an apparatus 100, 200, 300 having nanotube and metal composite interconnects in accordance with embodiments described herein. System 500 may also include random access memory (RAM) or other storage device 520 (may be referred to as memory), coupled to bus 505 and may store information and instructions that may be executed by processor 510.

Memory 520 may also be used to store temporary variables or other intermediate information during execution of instructions by processor 510. Memory 520 is a flash memory device in one embodiment. In another embodiment, memory 520 includes an apparatus 100, 200 having nanotube and metal composite interconnects as described herein.

System 500 may also include read only memory (ROM) and/or other static storage device 530 coupled to bus 505 that may store static information and instructions for processor 510. Data storage device 540 may be coupled to bus 505 to store information and instructions. Data storage device 540 such as a magnetic disk or optical disc and corresponding drive may be coupled with electronic system 500.

Electronic system 500 may also be coupled via bus 505 to display device 550, such as a cathode ray tube (CRT) or liquid crystal display (LCD), to display information to a user. Alphanumeric input device 560, including alphanumeric and other keys, may be coupled to bus 505 to communicate information and command selections to processor 510. Another type of user input device is cursor control 570, such as a mouse, a trackball, or cursor direction keys to communicate information and command selections to processor 510 and to control cursor movement on display 550.

Electronic system 500 further may include one or more network interfaces 580 to provide access to network, such as a local area network. Network interface 580 may include, for example, a wireless network interface having antenna 585, which may represent one or more antennae. Network interface 580 may also include, for example, a wired network interface to communicate with remote devices via network cable 587, which may be, for example, an Ethernet cable, a coaxial cable, a fiber optic cable, a serial cable, or a parallel cable.

In one embodiment, network interface 580 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 580 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 500 includes one or more omnidirectional antennae 585, which may refer to an antenna that is at least partially omnidirectional and/or substantially omnidirectional, and a processor 510 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus, comprising:
   a microelectronic device comprising one or more transistors;
   at least one electrical component associated with the microelectronic device;
   an interlayer dielectric (ILD) disposed between the microelectronic device and the at least one electronic component associated with the microelectronic device; and
   one or more interconnect structures coupled to the ILD, at least one interconnect structure comprising a composite of metal and at least one nanotube, the at least one interconnect structure electrically coupling the microelectronic device to the electronic component associated with the microelectronic device.

2. An apparatus according to claim 1, wherein the at least one interconnect structure comprises parallel line structures separated by substantially uniform pitch of about 5 nm to 30 nm and a width of about 2 nm to 20 nm, the line structures electrically couple the one or more transistors of the microelectronic device with other the at least one electrical component associated with the microelectronic device, wherein the at least one nanotube comprising oriented or semi-oriented nanotubes that are substantially oriented in a lengthwise direction that is substantially parallel to the line structures.

3. An apparatus according to claim 1, wherein the one or more interconnect structures comprise a resistivity of about 1 to 10 $\mu\Omega$-cm and a Jmax greater than about $1\times10^6$ A/cm$^2$.

4. An apparatus according to claim 1, wherein the at least one nanotube comprises at least one single-wall nanotube, a multi-wall nanotube, an oriented nanotube, a semi-oriented nanotube, or combinations thereof, wherein the at least one nanotube comprises carbon, boron, or combinations thereof, and wherein the at least one nanotube comprises an average length greater than about 5 μm.

5. An apparatus according to claim 1, wherein the metal comprises Au, Ru, Cu, Ag, Co, Al, or combinations thereof.

6. An apparatus according to claim 1, wherein a percentage of the metal by volume in the composite and a percentage of the at least one nanotube by volume in the composite are about equivalent, and wherein the composite comprises greater than about $5\times10^{13}$ nanotubes/cm$^2$.

* * * * *